(12) United States Patent
Gaeta et al.

(10) Patent No.: US 7,737,759 B2
(45) Date of Patent: Jun. 15, 2010

(54) LOGARITHMIC LINEAR VARIABLE GAIN CMOS AMPLIFIER

(75) Inventors: Marco Gaeta, Sant' Angelo Lodigiano (IT); Giacomino Bollati, Castel San Giovanni (IT); Marco Bongiorni, Castel San Giovanni (IT)

(73) Assignee: STMicroelectronics S.r.L., Agrate Brianza (MI) (IT)

( * ) Notice: Subject to any disclaimer, the term of this patent is extended or adjusted under 35 U.S.C. 154(b) by 54 days.

(21) Appl. No.: 10/931,469

(22) Filed: Sep. 1, 2004

(65) Prior Publication Data
US 2005/0052216 A1 Mar. 10, 2005

(30) Foreign Application Priority Data
Sep. 2, 2003 (EP) ................... 03425568

(51) Int. Cl.
G06G 7/24 (2006.01)
(52) U.S. Cl. ................ 327/352; 327/63; 330/254
(58) Field of Classification Search .......... 327/350–352
See application file for complete search history.

(56) References Cited

U.S. PATENT DOCUMENTS

| 5,467,046 | A * | 11/1995 | Kimura | 327/351 |
| 5,886,579 | A | 3/1999 | Mangelsdorf | 330/253 |
| 6,584,486 | B1 * | 6/2003 | Helfenstein et al. | 708/835 |
| 6,894,552 | B2 * | 5/2005 | Iorga et al. | 327/280 |
| 6,985,036 | B2 * | 1/2006 | Bhattacharjee et al. | 330/254 |
| 2002/0048109 | A1 * | 4/2002 | Chaiken et al. | 360/67 |

FOREIGN PATENT DOCUMENTS

EP        1024450         8/2000

OTHER PUBLICATIONS

William H. Hayt, Jr. & Jack E. Kemmerly, Engineering Circuit Analysis 34 (3rd ed. 1978).*
Stan Gibilisco, The Illustrated Dictionary of Electronics 477 (8th ed. 2001).*

* cited by examiner

*Primary Examiner*—Lincoln Donovan
*Assistant Examiner*—Ryan C Jager
(74) *Attorney, Agent, or Firm*—Lisa K. Jorgenson; Allen, Dyer, Doppelt, Milbrath & Gilchrist, P.A.

(57) ABSTRACT

A logarithmic linear variable gain CMOS amplifier includes first and second differential pairs of transistors forming a differential input, with each differential pair of transistors including a common source node. A pair of diode-connected load transistors is connected to the first and second differential pairs of transistors, and a third differential pair of transistors is connected to the pair of diode-connected load transistors. The third differential pair of transistors include respective gates connected together and in parallel to gates of the first and second differential pairs of transistors. First and second current mirrors are respectively connected to the common source nodes of the first and second differential pairs of transistors for programmably injecting respective bias currents thereto, with a sum of the respective bias currents remaining constant.

15 Claims, 2 Drawing Sheets

LOGARITHMIC LINEAR VARIABLE GAIN CMOS AMPLIFIER

FIELD OF THE INVENTION

The present invention relates in general to integrated analog circuits, and in particular, to an integrated logarithmic linear variable gain CMOS amplifier.

BACKGROUND OF THE INVENTION

State of the art logarithmic linear amplifiers are based on a circuit structure as illustrated in FIG. 1. Such a structure is disclosed in U.S. Patent Application No. 2002/0048109. The gain of these amplifiers commonly use two stages for increasing the gain range, which is given by the following equation:

$$\text{Gain} = \sqrt{\frac{1+x}{1-x}} \quad (1)$$

The linear logarithmic gain (dB gain) variation range of the function is relatively restricted. Generally, the value of x of the gain expression for remaining substantially in the linear dB gain variation range is limited to $-0.7<x<0.7$.

The variation of the bias current in a transistor notably alters its transconductance, thus obtaining the desired behavior of the circuit according to equation 1. However, the variation of the bias current also affects the bandwith and the linearity of the amplifier.

The group delay of the amplifier circuit is inversely proportional to the bandwith. It would be very desirable to render the group delay independent from the gain to prevent interaction between the gain loop and the phase loop.

Variable gain amplifiers work with a fixed output voltage swing (fixed by the control loop) and the gain is inversely proportional to the input voltage swing. While it would be highly desirable that linearity should be inversely proportional to the gain, unfortunately the known amplifier structures such as the one depicted in FIG. 1 has the opposite behavior.

SUMMARY OF THE INVENTION

In view of the foregoing background, an object of the present invention is to provide a logarithmic linear variable gain amplifier wherein the group delay is rendered substantially independent from the gain and the linearity of the amplifier is inversely proportional to the gain.

This and other objects, advantages and features in accordance with the present invention is provided in a relatively straightforward manner, without substantially adding complexity to the basic circuit of an integrated logarithmic linear variable gain amplifier, by cross connecting two differential pairs of transistors that share the same diode loads and by biasing the two differential pairs of transistors connected with currents so that their sum remains constant.

This is achieved by mirroring in the common current node of the two differential pairs of transistors the required bias currents provided by the linear DAC and which have values A+x and B−x, respectively, where A and B are the respective bias currents and x is the variable factor. In this way, the sum of the two currents is kept constant as well as the bandwith that depends on it.

According to an optional but preferred embodiment, the diode loads, common to the two cross connected differential input stages, have transistors connected in parallel thereto for subtracting a constant current of a desired value from the current that would otherwise be flowing through the diode loads. This permits translation of the gain curve of the amplifier according to needs.

DETAILED DESCRIPTION OF THE PREFERRED EMBODIMENTS

Figure 2:
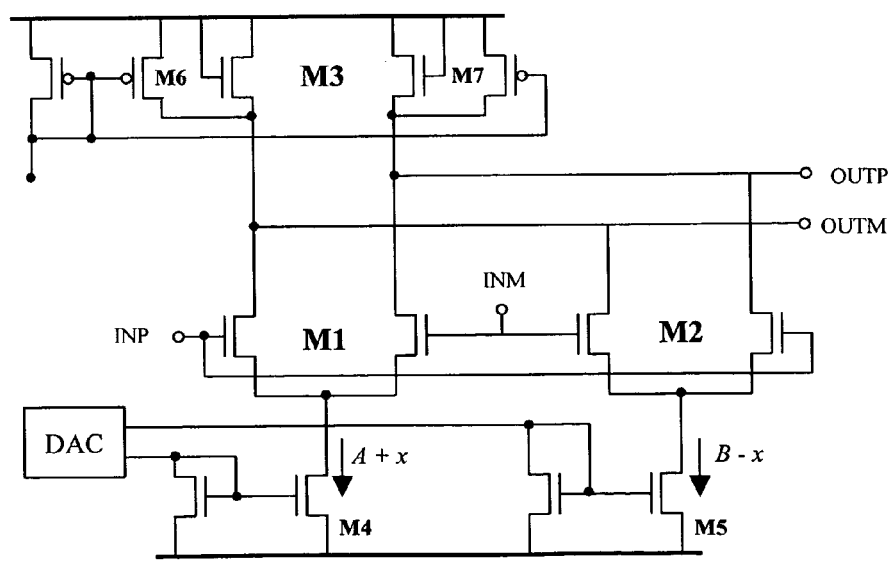
FIG. 2 is a circuit diagram of a logarithmic linear variable gain CMOS amplifier according to a preferred embodiment of the present invention.

As depicted in FIG. 2, the two differential transistor pairs M1 and M2, sharing the same diode-connected load transistors M3, are cross connected to the inpuit nodes INP and INM of the amplifier according to an essential feature of the circuit of the present invention.

The transconductance of the first input differential pair of transistors M1 is $gm_1$, the transconductance of the second input differential pair of transistors M2 is $gm_2$, and the transconductance of the diode-connected load transistors M3 is $gm_3$. It may be demonstrated that the gain of the amplifier is given by the following equation:

$$\text{Gain} = \frac{gm_1 - gm_2}{gm_3} = \frac{\sqrt{K_1 \cdot I_1} - \sqrt{K_2 \cdot I_2}}{\sqrt{K_3 \cdot I_3}} \quad (2)$$

where $K_i$ is the transistor's gain constant proportional its aspect ratio W/L; $I_1$, $I_2$ and $I_3$ are the respective bias currents of M1, M2 and M3; and the bandwith is given by the following equation:

$$\text{Bandwidth} \cong \frac{\sqrt{K_3 \cdot I_3}}{\pi \cdot C_{out}} \quad (3)$$

wherein $C_{out}$ is the capacitance of the output node, referred to the virtual ground node of the circuit.

Customarily, the two differential pairs of transistors M1 and M2 are biased by respective currents output by a linear digital-to-analog converter DAC through respective current mirrors M4 and M5. The pair of the diodes M3 connected to the load transistors is biased by the difference-between the sum of these currents and the currents flowing in transistors M6 and M7.

According to an essential condition of the invention, the two bias currents have a value given by expressions of the type A+x and B−x, where A and B are the preestablished bias current values while x represents the variable factor. Therefore, the sum of the two bias currents is kept constant such that $I_3 = I_1 + I_2$.

In the case of the preferred embodiment depicted in FIG. 2, wherein transistors M6 and M7 are included for subtracting a constant amount of the current that would otherwise be flowing in the two diode-connected load transistors M3. The sum current $I_{TOT}$ will be equal to the actual bias current $I_3$ minus the constant amount of current that is flowing through the optionally added transistors M6 and M7. In any case, the effective bias current $I_3$ of the bandwidth equation 3 will be constant, ensuring a constant bandwidth.

Accordingly, the gain in dB is given by the following equation:

$$\left(\frac{v_{out}}{v_{in}}\right)_{dB} = 20 \cdot \log\left(\sqrt{K_1 \cdot Id_1} - \sqrt{K_2 \cdot Id_2}\right) - 10 \cdot \log(K_3 \cdot Id_3) \quad (4)$$

$$\text{with } Id_1 > \frac{K_2}{K_1} \cdot Id_2$$

By observing equation 4, it may be easily recognized that the gain of the amplifier is linearly controlled by $I_1$ and $I_2$. While modifying the current $I_3$, it is possible to translate the gain characteristic.

According to the preferred embodiment shown in FIG. 2, additional transistors M6 and M7 respectively connected in parallel to the diode-connected load transistors M3 are used to subtract a certain constant amount for the total current that would be flowing through the diode-connected load transistors M3. In this way, the current that actually flows through the diode-connected load transistors M3 may be fixed for setting the gm of the transistors M3, and therefore, to translate the gain characteristic.

By substituting $I_3 = I_1 + I_2$ in equation 4, the following equation is obtained:

$$\left(\frac{v_{out}}{v_{in}}\right)_{dB} = 20 \cdot \log\left(\sqrt{I_3 \cdot I_2} - \sqrt{\frac{K_2}{K_1} \cdot Id_2}\right) - 10 \cdot \log\left(\frac{K_1}{K_3 \cdot Id_3}\right) \quad (5)$$

$$\text{with } I_3 > \left(\frac{K_2}{K_1} + 1\right) \cdot Id_2$$

Figure 3:
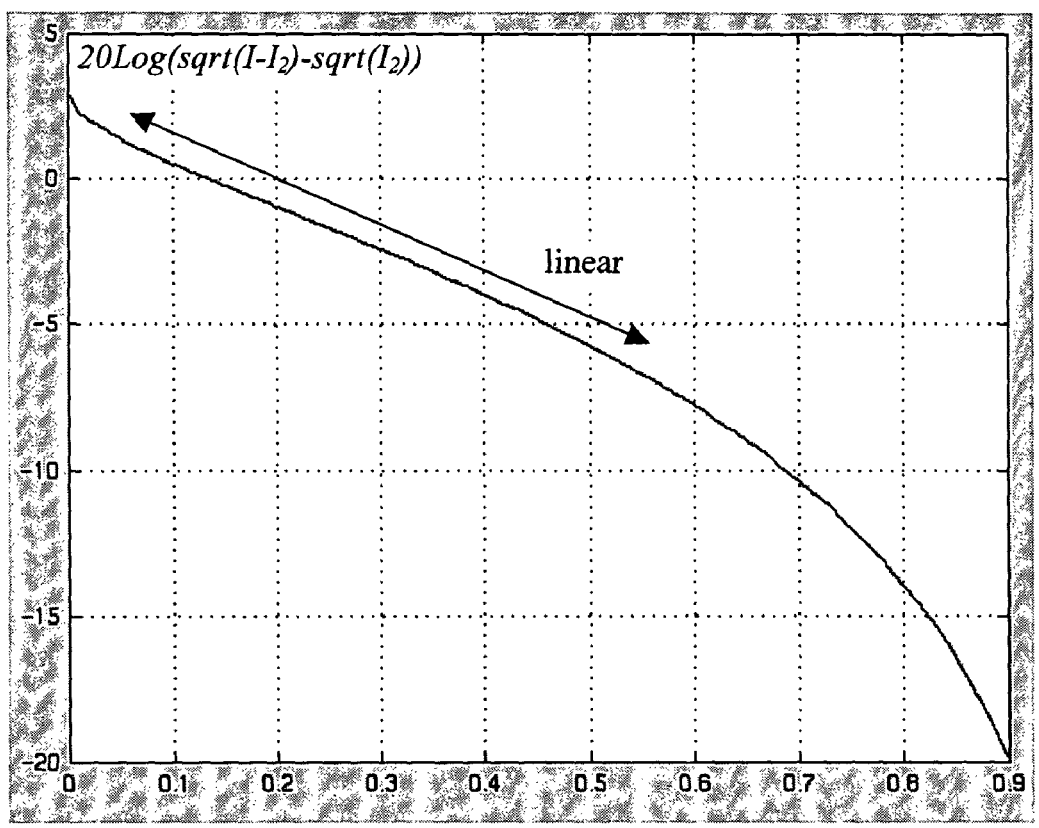
FIG. 3 is a diagram of the gain characteristics of an amplifier according to the present invention.

Equation 5 may be plotted as shown in FIG. 3 to show the linear variation range of the dB gain figure. The amplifier provides for an output signal of fixed amplitude while the input signal varies its amplitude.

When the gain is relatively high, the current in the first input differential pair of transistors M1 is much larger than the current in the second input differential pair of transistors M2. Under these conditions, linearity of the first differential input pair of transistors M1 is very good because its over bias is relatively high, while the linearity of the other differential input pair of transistors M2 is relatively poor. However, this is not a problem because the contribution of the second differential pair M2 to the output current is proportionally very small, and even its distortion has a negligible impact on the output current.

The gain is reduced by reducing the current in the first differential input pair of transistors M1 and complementarily increasing the current in the second input differential pair of transistors M2. By reducing the current in the first differential input pair of transistors M1 while the input signal swing is increasing is detrimental to its linearity, but at the same time the linearity of the other differential input pair of transistors M2 is improving. In addition, the third harmonic of transistors M2 is subtracted from the third harmonic of transistors M1, thus enhancing the overall linearity of the amplifier, as may be inferred by the following equation:

$$i_{tot} = i_{1|H1} + i_{i|H3} - (i_{2|H1} + i_{2|H3}) \quad (6)$$

where $i_{i|H1}$ indicates the first harmonic of the respective current signal $i_1$.

Figure 1:
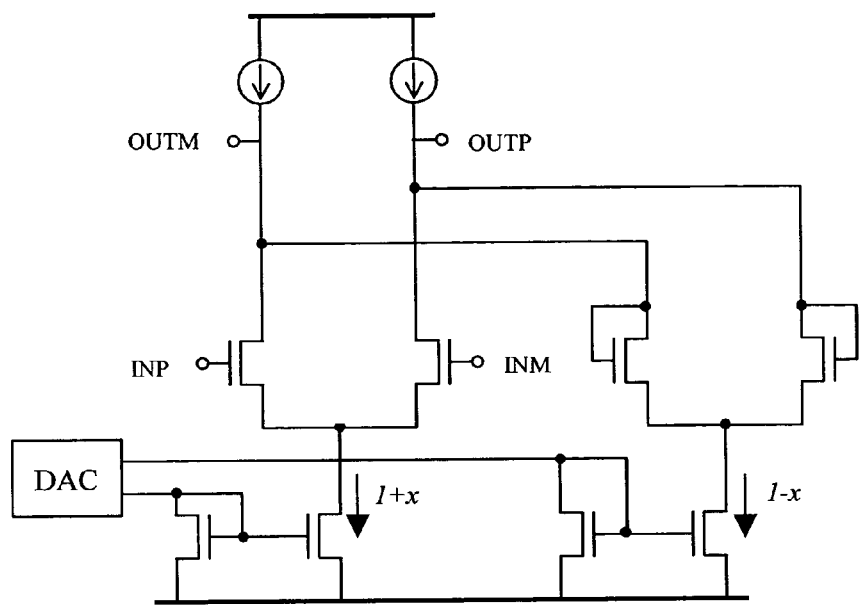
FIG. 1 is a basic circuit diagram of a state of the art integrated logarithmic linear variable gain CMOS amplifier according to the prior art.

In conclusion, the novel amplifier of the invention has a markedly improved linearity in comparison with the known amplifier circuit of FIG. 1. Although the variable gain logarithmic linear amplifier with improved linearity characteristics of the invention may have numerous applications, an important application in which the amplifier is particularly useful is in data acquisition channels from a mass storage drive, such as a hard disk drive.

That which is claimed is:

1. A logarithmic linear variable gain CMOS amplifier comprising:
    a first differential pair of transistors forming a differential input comprising a common source node, each transistor of said first differential pair of transistors comprising a control node;
    a pair of diode-connected load transistors connected to said first differential pair of transistors;
    a second differential pair of transistors connected to said pair of diode-connected load transistors, and comprising a common source node and respective control nodes connected to the control nodes of said first differential pair of transistors;
    first and second current mirrors respectively connected to the common source nodes of said first and second differential pairs of transistors for programmably injecting respective bias currents thereto, with a sum of the respective bias currents remaining constant; and
    a digital-to-analog converter connected to said first and second current mirrors for setting the respective bias currents therefrom, with the respective bias currents output by said digital-to-analog converter respectively having values (A+x) and (B−x), with A and B not being equal to one another and with A and B being programmed constant bias current values and x being a variable factor.

2. A logarithmic linear variable gain CMOS amplifier according to claim 1, further comprising respective transistors connected to said pair of diode-connected load transistors for subtracting a current from the sum of the respective bias currents that would otherwise be flowing through said pair of diode-connected load transistors.

3. A logarithmic linear variable gain CMOS amplifier according to claim 2, wherein said pair of diode-connected load transistors comprise transistors of a first conductivity type; and wherein the respective transistors connected to said pair of diode-connected load transistors comprise transistors of a second conductivity type.

4. A logarithmic linear variable gain CMOS amplifier according to claim 1, wherein current in said pair of diode-connected load transistors is varied for translating gain characteristics of the amplifier.

5. A variable gain CMOS amplifier comprising:
    a first differential pair of NMOS transistors forming a differential input comprising a common source node, each NOMS transistor of said first differential pair of NMOS transistors comprising a control node;
    a pair of diode-connected NMOS load transistors connected to said first differential pair of NMOS transistors;
    a second differential pair of NMOS transistors connected to said pair of diode-connected NMOS load transistors, and comprising a common source node and respective control nodes connected to the control nodes of said first differential pair of NMOS transistors;
    first and second current mirrors respectively connected to the common source nodes of said first and second differential pairs of NMOS transistors for providing respective bias currents thereto, with a sum of the respective bias currents remaining constant; and a digital-to-analog converter connected to said first and second current mirrors for setting the respective bias currents therefrom, with the respective bias currents output by said digital-to-analog converter respectively having values (A+x) and (B−x), with A and B not being equal to one another and with A and B being programmed constant bias current values and x being a variable factor.

6. A variable gain CMOS amplifier according to claim 5, further comprising respective PHOS transistors connected to said pair of diode-connected NMOS load transistors for subtracting a current from the sum of the respective bias currents that would otherwise be flowing through said pair of diode-connected NMOS load transistors.

7. A variable gain CMOS amplifier according to claim 5, wherein current in said pair of diode-connected NMOS load transistors is varied for translating gain characteristics of the amplifier.

8. A variable gain amplifier comprising:

a first differential pair of transistors forming a differential input comprising a common conduction terminal, each transistor of said first differential pair of transistors comprising a control terminal;

a pair of diode-connected load transistors connected to said first differential pair of transistors;

a second differential pair of transistors connected to said pair of diode-connected load transistors, and comprising a common conduction terminal and respective control terminals connected to the control terminals of said first differential pair of transistors;

first and second current mirrors respectively connected to the common conduction terminals of said first and second differential pairs of transistors for providing respective bias currents thereto, with a sum of the respective bias currents remaining constant; and a digital-to analog converter connected to said first and second current mirrors for setting the respective bias currents therefrom, with the respective bias currents output by said digital-to-analog converter respectively having values (A+x) and (B−x), with A and B not being equal to one another and with A and B being programmed constant bias current values and x being a variable factor.

9. A variable gain amplifier according to claim 8, further comprising respective transistors connected to said pair of diode-connected load transistors for subtracting a current from the sum of the respective bias currents that would otherwise be flowing through said pair of diode-connected load transistors.

10. A variable gain amplifier according to claim 9, wherein said pair of diode-connected load transistors comprise transistors of a first conductivity type; and wherein the respective transistors connected to said pair of diode-connected load transistors comprise transistors of a second conductivity type.

11. A variable gain amplifier according to claim 8, wherein current in said pair of diode-connected load transistors is varied for translating gain characteristics of the amplifier.

12. A method for operating a variable gain amplifier comprising a first differential pair of transistors forming a differential input comprising a common conduction terminal, each transistor of the first differential pair of transistors comprising a control terminal; a pair of diode-connected load transistors connected to the first differential pair of transistors; a second differential pair of transistors connected to the pair of diode-connected load transistors, and comprising a common conduction terminal and control terminals connected to the control terminals of the first differential pair of transistors; and first and second current mirrors respectively connected to the common conduction terminals of the first and second differential pairs of transistors; a digital-to-analog converter connected to the first and second current mirrors for setting the respective bias currents therefrom, the method comprising:

operating the digital-to-analog converter for providing respective bias currents from the first and second current mirrors to the common conduction terminals of the first and second differential pairs of transistors, with a sum of the respective bias currents remaining constant, and with the respective bias currents output by the digital-to-analog converter respectively having values (A+x) and (B−x), with A and B not being equal to one another and with A and B being programmed constant bias current values and x being a variable factor.

13. A method according to claim 12, wherein the variable gain amplifier further comprises respective transistors connected to the pair of diode-connected load transistor for subtracting a current from the sum of the respective bias currents that would otherwise be flowing through the pair of diode-connected load transistors.

14. A method according to claim 13, wherein the pair of diode-connected load transistors comprise transistors of a first conductivity type; and wherein the respective transistors connected to the pair of diode-connected load transistors comprise transistors of a second conductivity type.

15. A method according to claim 12, further comprising varying current in the pair of diode-connected load transistors for translating gain characteristics of the amplifier.

* * * * *

UNITED STATES PATENT AND TRADEMARK OFFICE
CERTIFICATE OF CORRECTION

PATENT NO. : 7,737,759 B2
APPLICATION NO. : 10/931469
DATED : June 15, 2010
INVENTOR(S) : Gaeta et al.

It is certified that error appears in the above-identified patent and that said Letters Patent is hereby corrected as shown below:

| | |
|---|---|
| Front Page, Abstract Line 8-10 | Delete: "The third differential pair of transistors include respective gates connected together and in parallel to gates of the first and second differential pairs of transistors." <br> Insert: --The third differential pair of transistors includes respective gates connected together and in parallel to gates of the first and second differential pairs of transistors.-- |
| Column 1, Line 41 | Delete: "has" <br> Insert: --have-- |
| Column 1, Line 52 | Delete: "is" <br> Insert: --are-- |
| Column 2, Line 23 | Delete: "inpuit" <br> Insert: --input-- |
| Column 2, Line 39 | Delete: "proportional its" <br> Insert: --proportional to its-- |
| Column 2, Line 41 | Delete: "bandwith" <br> Insert: --bandwidth-- |
| Column 4, Line 1 | Delete: "$i_{1H1}$" <br> Insert: --$i_{1|H1}$-- |
| Column 4, Line 57 | Delete: "NOMS" <br> Insert: --NMOS-- |
| Column 5, Line 14 | Delete: "PHOS" <br> Insert: --PMOS-- |

Signed and Sealed this

Fourteenth Day of September, 2010

David J. Kappos
*Director of the United States Patent and Trademark Office*

Column 5, Line 41     Delete: "digital-to analog"
                      Insert: --digital-to-analog Column 6, Line 39     Delete: "transistor"
                      Insert: --transistors--